United States Patent [19]
Midya

[11] Patent Number: 5,905,407
[45] Date of Patent: May 18, 1999

[54] HIGH EFFICIENCY POWER AMPLIFIER USING COMBINED LINEAR AND SWITCHING TECHNIQUES WITH NOVEL FEEDBACK SYSTEM

[75] Inventor: Pallab Midya, Schaumburg, Ill.

[73] Assignee: Motorola, Inc., Schaumburg, Ill.

[21] Appl. No.: 08/902,802

[22] Filed: Jul. 30, 1997

[51] Int. Cl.[6] ........................... H03F 3/38
[52] U.S. Cl. .............. 330/10; 330/207 A; 455/126
[58] Field of Search .................. 330/10, 251, 207 A; 455/126, 115

[56] References Cited

U.S. PATENT DOCUMENTS

| | | | |
|---|---|---|---|
| 4,152,670 | 5/1979 | Rimondini et al. | 330/10 |
| 4,446,440 | 5/1984 | Bell | 330/207 A |
| 4,523,152 | 6/1985 | Garde | 330/151 |
| 4,600,891 | 7/1986 | Taylor, Jr. et al. | 330/207 A |
| 5,329,245 | 7/1994 | Hammond et al. | 330/251 |
| 5,352,986 | 10/1994 | Modgil et al. | 330/10 |
| 5,543,753 | 8/1996 | Williamson | 330/297 |

OTHER PUBLICATIONS

Pallab Midya and Philip T. Krein, "Feed–forward active filter for output ripple cancellation", pp. 1–14, 1994, USA.

Pallab Midya, Matthew Greuel, and Philip T. Krein, "Sensorless Current Mode Control–An Observer–Based Technique for Dc–Dc Converters", IEEE Power Electronics Specialists Conference Record, pp. 197–202, Jun. 22, 1997, USA.

*Primary Examiner*—Benny Lee
*Assistant Examiner*—Khanh V. Nguyen
*Attorney, Agent, or Firm*—R. Louis Breeden

[57] ABSTRACT

An amplifier (100) includes an output node (114) having an output voltage ($V_{out}$), and a switching amplifier (104) having a first output (132) coupled to the output node for delivering a switching amplifier output current ($I_{SW}$) to the output node. The amplifier further includes a modulator (136) coupled to the switching amplifier for controlling the switching amplifier, and a linear amplifier (102) producing a linear amplifier output current ($I_{lin}$) through a second output (118) coupled to the output node. The amplifier also includes a feedback network (106) coupled to the modulator for controlling the modulator, the feedback network also coupled to a reference signal ($V_{ref}$) which the amplifier apparatus tracks, the feedback network further coupled to a current sense signal ($I_{sen}$) proportional to the linear amplifier output current, and coupled to a switching amplifier signal ($V_{int}$) internal to the switching amplifier, the switching amplifier signal not derived from the output voltage and not generated by sensing the switching amplifier output current.

20 Claims, 10 Drawing Sheets

100

400

600

700

800

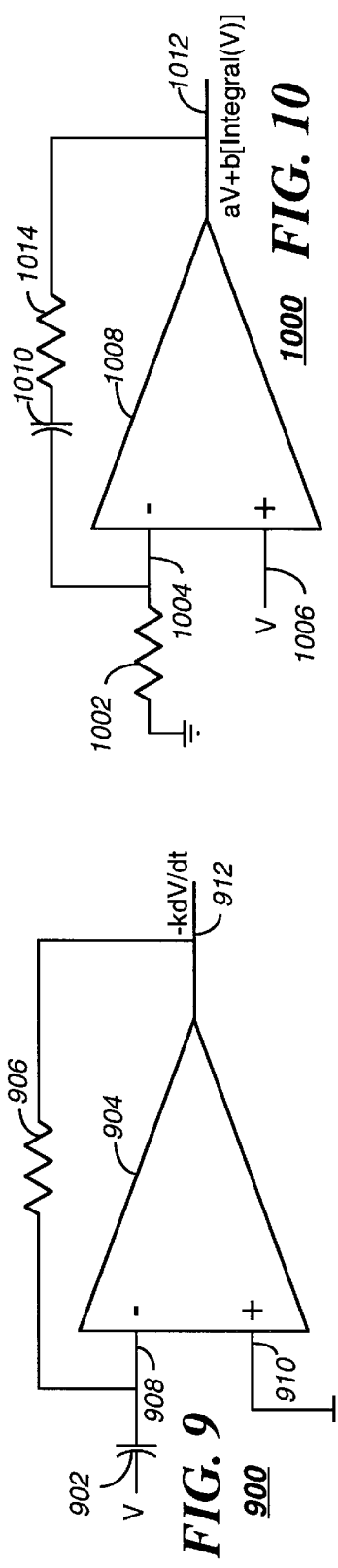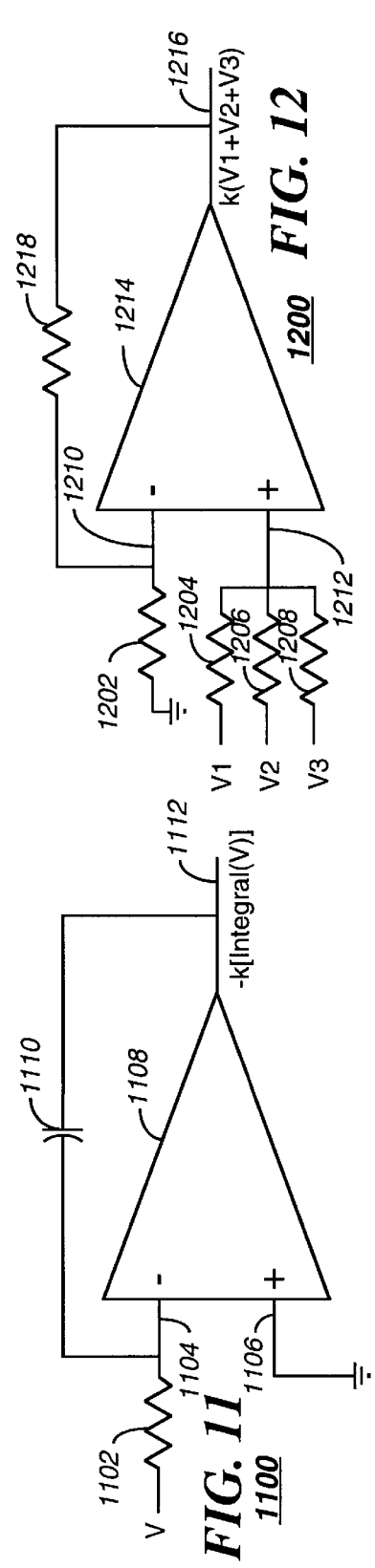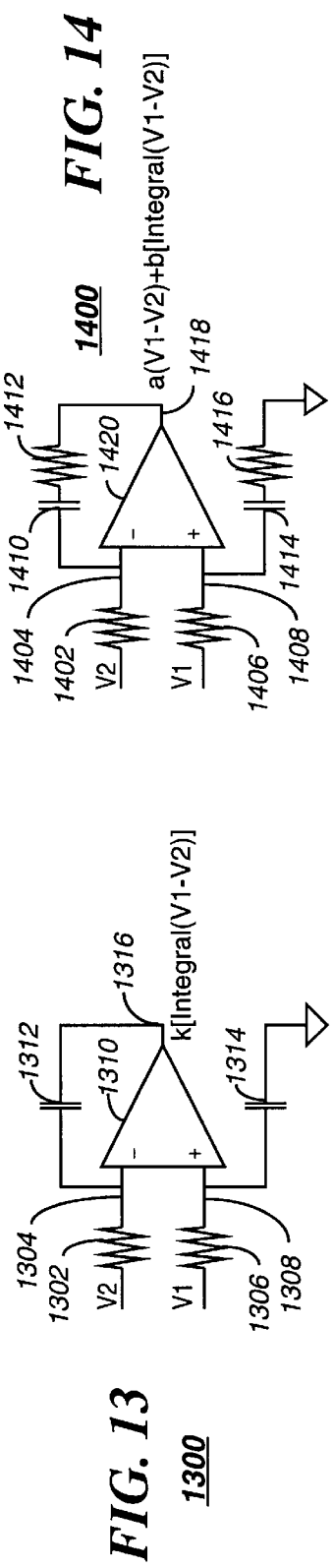

HIGH EFFICIENCY POWER AMPLIFIER USING COMBINED LINEAR AND SWITCHING TECHNIQUES WITH NOVEL FEEDBACK SYSTEM

FIELD OF THE INVENTION

This invention relates in general to amplifiers, and more specifically to high efficiency power amplifiers as applied to radio frequency transmitters.

BACKGROUND OF THE INVENTION

To obtain high efficiency in a baseband power amplifier it is necessary to use switching techniques. A switching amplifier is known to produce switching noise. Prior art switching amplifiers have used passive filtering to reduce the switching noise. Such filtering limits the bandwidth of the amplifier, adversely affecting the slew rate and transient response time of the amplifier.

One method of reducing the switching noise without limiting the bandwidth more than an acceptable amount has been to increase the switching frequency. An undesirable side effect of increased switching frequency, however, is increased power consumption.

Thus, what is needed is an apparatus for providing a high bandwidth, low noise baseband amplifier which operates at a lower switching frequency than possible in prior art switching amplifiers.

SUMMARY OF THE INVENTION

An aspect of the present invention is an amplifier apparatus. The amplifier apparatus comprises an output node having an output voltage, and a switching amplifier having a first output coupled to the output node for delivering a switching amplifier output current to the output node. The amplifier apparatus further comprises a modulator coupled to the switching amplifier for controlling the switching amplifier, and a linear amplifier producing a linear amplifier output current through a second output coupled to the output node. The amplifier apparatus also includes a feedback network coupled to the modulator for controlling the modulator, the feedback network also coupled to a reference signal which the amplifier apparatus tracks, the feedback network further coupled to a current sense signal proportional to the linear amplifier output current, and coupled to a switching amplifier signal internal to the switching amplifier, the switching amplifier signal not derived from the output voltage and not generated by sensing the switching amplifier output current.

Another aspect of the present invention is a radio transmitter. The radio transmitter comprises a power supply reference generator for generating a reference signal, and an amplifier apparatus coupled to the power supply reference generator for generating an output signal that tracks the reference signal. The radio transmitter further comprises a radio frequency (RF) power amplifier coupled to the amplifier apparatus for amplifying an RF signal, the RF power amplifier powered by the output signal of the amplifier apparatus and producing an amplified RF signal; and an RF source for generating the RF signal. The amplifier apparatus comprises an output node having an output voltage, and a switching amplifier having a first output coupled to the output node for delivering a switching amplifier output current to the output node. The amplifier apparatus further comprises a modulator coupled to the switching amplifier for controlling the switching amplifier, and a linear amplifier producing a linear amplifier output current through a second output coupled to the output node. The amplifier apparatus also includes a feedback network coupled to the modulator for controlling the modulator, the feedback network also coupled to the reference signal, which the amplifier apparatus tracks, the feedback network further coupled to a current sense signal proportional to the linear amplifier output current, and coupled to a switching amplifier signal internal to the switching amplifier, the switching amplifier signal not derived from the output voltage and not generated by sensing the switching amplifier output current.

BRIEF DESCRIPTION OF THE DRAWINGS

FIGS. 9–14 are exemplary electrical block diagrams detailing portions of the feedback network in accordance with the present invention.

DETAILED DESCRIPTION OF THE DRAWINGS

Figure 1:
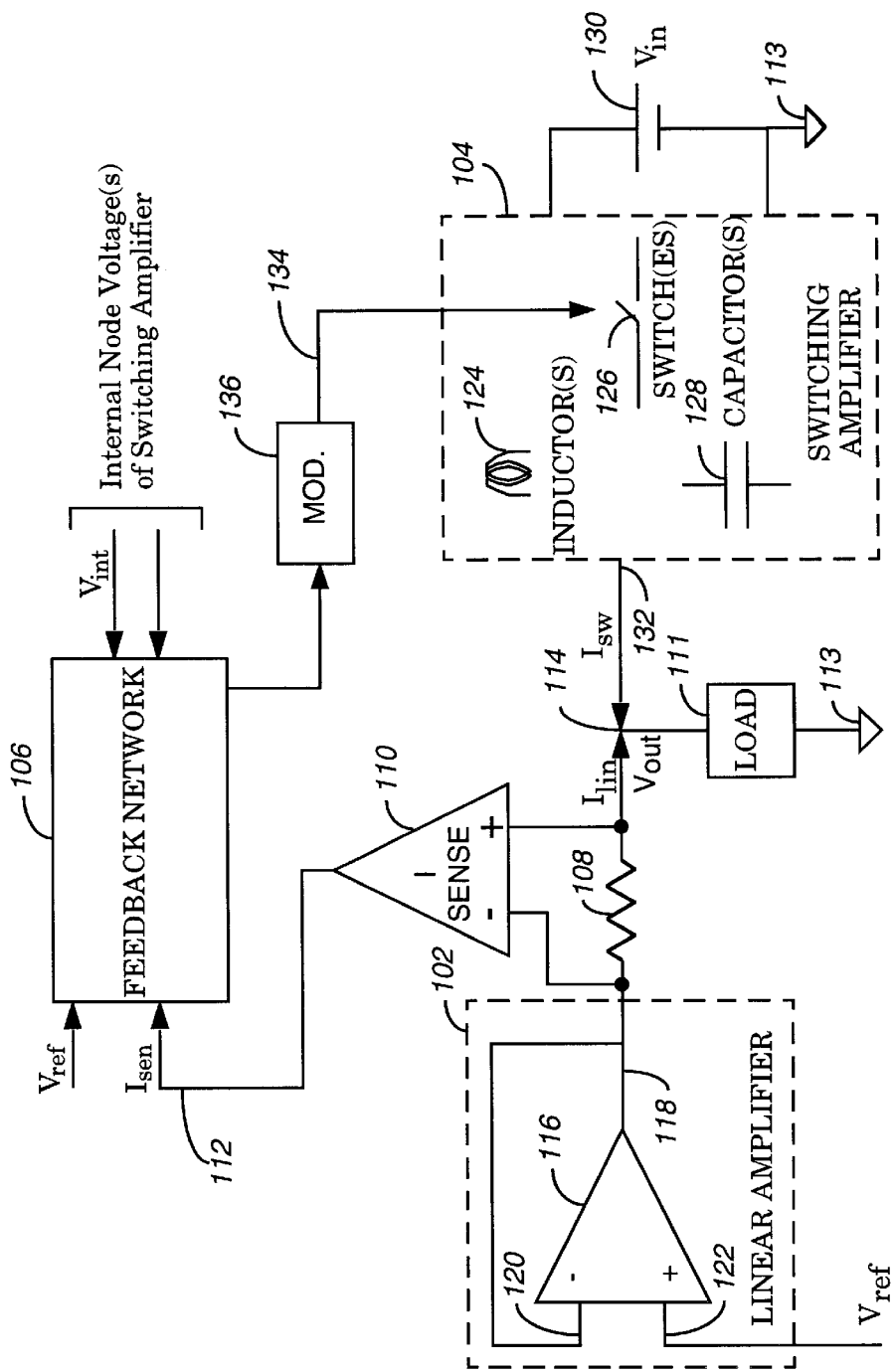
FIG. 1 is a generic electrical block diagram of a power amplifier in accordance with the present invention.

FIG. 1 is a generic electrical block diagram of a power amplifier 100 in accordance with the present invention. The amplifier 100 includes a linear amplifier 102 comprising a conventional power operational amplifier 116 coupled to a reference signal $V_{ref}$ at a positive input 122. Preferably, the power operational amplifier 116 is the PA04A amplifier manufactured by Apex-Microtech of Tucson, Ariz. It will be appreciated that other similar amplifiers can be used as well for the amplifier 116. The output 118 of the operational amplifier 116 is coupled to the negative input 120, such that the voltage at the output 118 of the operational amplifier 116 tracks the reference signal $V_{ref}$. The reference signal $V_{ref}$ is the desired output voltage of the amplifier 100. The output 118 is coupled through a resistor 108 to an output node 114. The resistance of the resistor 108 is preferably small, relative to the impedance of a load 111 coupled between the output node 114 and a common node 113, e.g., 1 percent of the load impedance. Inputs of a conventional differential amplifier 110 are coupled across the resistor 108 for generating a current sense voltage $I_{sen}$ proportional to the output current $I_{lin}$ of the linear amplifier 102 at a current sense output 112.

The output 132 of a conventional switching amplifier 104 is coupled in parallel with the linear amplifier 102 at the output node 114. The switching amplifier 104 comprises at least one switch 126 for switching an input voltage $V_{in}$ across at least one filter comprising an inductor 124 and a capacitor 128. The duty cycle of the switch(es) 126 is controlled by a signal from a modulator 136 having a modulator output 134 and coupled to a feedback network 106 for receiving a control signal therefrom. The switch modulation preferably is pulse width modulation (PWM). This has the advantage of having a fixed frequency of operation and of being synchronized externally. The sensing of the output current $I_{SW}$ of the switching amplifier 104 preferably is avoided due to noise and signal to noise ratio (SNR) considerations. Because the linear amplifier 102 is connected to the load 111 directly (except for the small resistor 108), the linear amplifier 102 substantially determines the output voltage $V_{out}$ at the output node 114. This greatly reduces the switching ripple present in the output, thereby advantageously allowing a more efficient, lower switching frequency to be utilized for the switching amplifier 104. The output voltage $V_{out}$ is, however, not suitable for control of the switching amplifier 104. It is therefore preferable to construct a feedback scheme which does not require output feedback.

Inputs to the feedback network 106 include the reference signal $V_{ref}$, the current sense voltage $I_{sen}$, and at least one signal $V_{int}$ internal to the switching amplifier 104, the at least one signal $V_{int}$ not derived from the output voltage across the load 111 and not generated by sensing the output current of the switching amplifier 104. The feedback network 106, the modulator 136 and the switching amplifier 104 cooperate to regulate the output current $I_{SW}$ of the switching amplifier such that the average value of the output current $I_{lin}$ of the linear amplifier 102 is driven to zero, thereby maximizing the efficiency of the amplifier 100.

Figure 2:
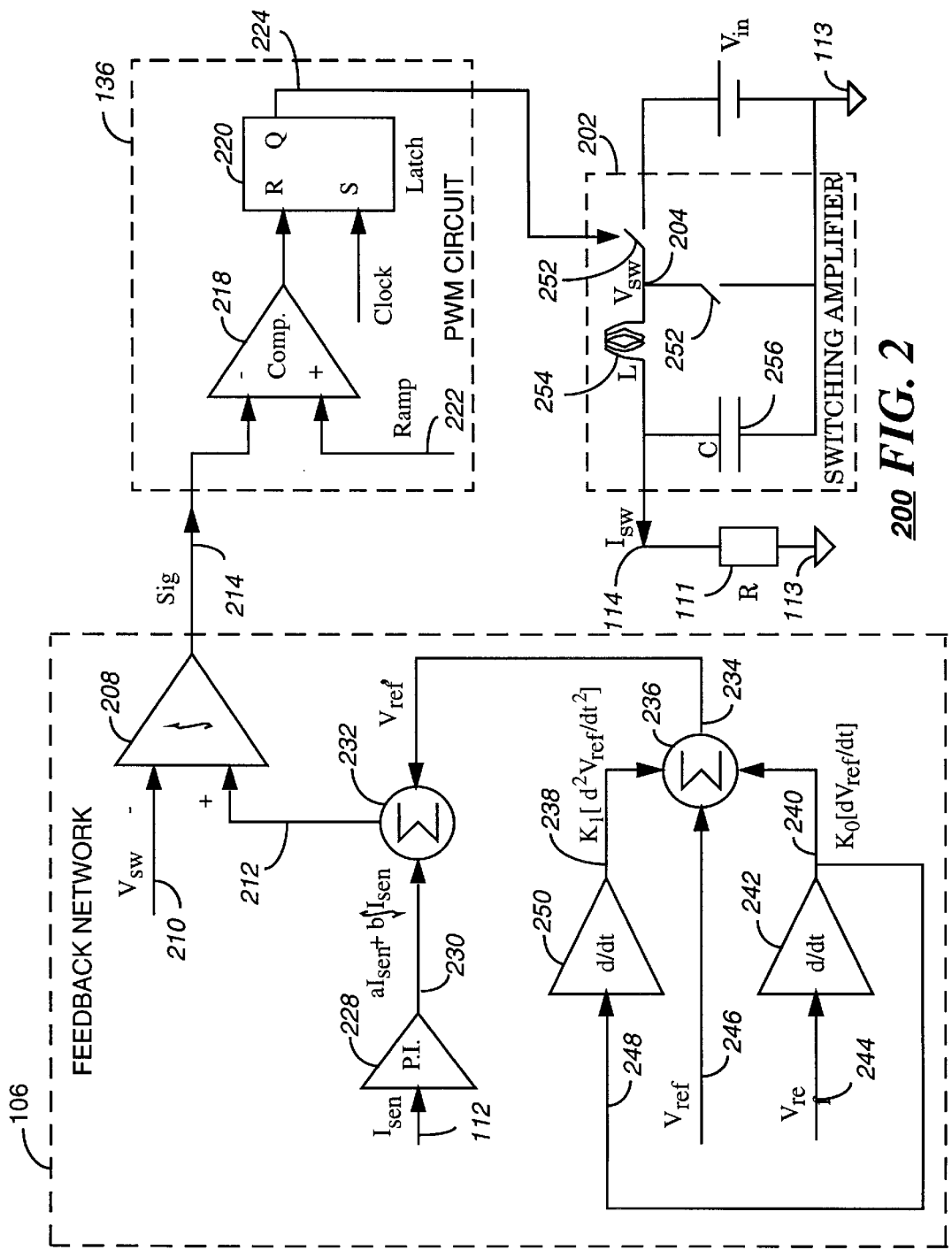
FIG. 2 is an electrical block diagram detailing a feedback network, a modulator, and a switching amplifier of a first embodiment of the power amplifier in accordance with the present invention.

FIG. 2 is an electrical block diagram detailing the feedback network 106 and the modulator 136, along with a conventional switching amplifier 202 of a first embodiment 200 of the power amplifier 100 in accordance with the present invention. The first embodiment 200 includes a switching amplifier 202 for efficiently delivering a switching amplifier output current $I_{SW}$ to the output node 114. The switching amplifier 202 preferably comprises two switches 252, which operate in a complementary fashion, one switch 252 being closed, while the other switch 252 is open, and vice versa, with a duty cycle controlled by the modulator 136, which preferably is a conventional pulse width modulator (PWM) circuit. Preferably, the switches 252 are constructed from conventional switching transistors. The switching amplifier 202 includes a single-stage filter comprising an inductor 254 coupled between a switching node 204 (which serves as the input node of the single-stage filter) and the output node 114. The filter further comprises a capacitor 256 coupled between the output node 114 and a common node 113.

The switching amplifier is coupled to the output 224 of the modulator 136. The modulator 136 preferably comprises a conventional comparator 218 coupled to a conventional latch 220. One input 222 of the comparator 218 is coupled to a ramp signal generated by a conventional ramp generator (not shown). The other input of the comparator 218 is coupled to the output 214 of a subtraction integrator 208 of the feedback network 106.

The feedback network 106 is preferably coupled to the switching node 204 of the switching amplifier for monitoring the voltage $V_{SW}$ present on the switching node 204. The voltage $V_{SW}$ preferably is coupled to the negative input 210 of the subtraction integrator 208 whose output is the output signal Sig of the feedback network 106. The positive input 212 of the subtraction integrator 208 is coupled to the output of a first summer 232. A first input of the first summer 232 is coupled to an intermediate signal $V_{ref}'$ to generated from the reference signal $V_{ref}$ and time derivatives of $V_{ref}$ in a manner that will be described below. A second input of the first summer 232 preferably is coupled to the output 230 of a proportional plus integral (P.I.) circuit 228. The input of the P.I. circuit is coupled to the current sense output 112 of the differential amplifier 110. The P.I. circuit 228 generates a signal $(aI_{sen}+b\ I_{sen})$ that is proportional to both $I_{sen}$ and the integral of $I_{sen}$. Alternatively, the P.I. circuit can be omitted and the second input of the summer 232 can be connected directly to the current sense output 112.

The intermediate signal $V_{ref}'$ is generated at the output 234 of a second summer 236. The inputs of the second summer 236 are coupled to the reference signal $V_{ref}$ and to first and second outputs 240, 238 of first and second differentiators 242 and 250, respectively. The input 244 of the first differentiator 242 is coupled to the reference signal $V_{ref}$. The gain of the first differentiator 242 is such that it generates an output signal equal to $K_0 \times dV_{ref}/dt$. The input 248 of the second differentiator 250 is coupled to the output 240 of the first differentiator 242. The gain of the second differentiator 250 is such that it generates an output signal equal to $K_1 \times d^2V_{ref}/dt^2$. $K_0$ and $K_1$ are defined below. Detailed examples of circuits for realizing the building blocks, e.g., the differentiators 242, 250 and the summers 232, 236, of this and other embodiments of the feedback network 106 are disclosed further below.

The use of the time derivatives of the reference signal Vref is a departure from the prior art, and a considerable improvement is obtained. When the load impedance (R) is approximately known, the transfer function of the passive L-C-R filter is known. In effect, the inverse of this transfer function is constructed using the derivatives of the reference signal Vref.

$$V_{ref}' = V_{ref} + K_0 \frac{dV_{ref}}{dt} + K_1 \frac{d^2 V_{ref}}{dt^2}$$

The PWM circuit is a sampled data system with variable delay between 0 and Ts, the period of the ramp signal at the input 222, depending upon the duty ratio required. The average delay is Ts/2. This delay is small compared to the delay in the output filter of the switching amplifier 202. This delay can also be compensated using the time derivatives of the reference signal Vref. The expressions for the coefficients $K_0$ and $K_1$ can be computed a priori when the nominal value of the load impedance is known (R). Alternatively, the coefficients $K_0$ and $K_1$ can be computed by a tuning technique. The nominal values of $K_0$ and $K_1$ are as follows.

$$K_0 = \frac{L}{R} + \frac{T_s}{2}$$

$$K_1 = LC + \left(\frac{T_s}{2}\right)\left(\frac{L}{R}\right)$$

Note that the terms with Ts compensate for the delay of the PWM circuit, while the other terms compensate for the delay of the R-L-C filter. The feedback signal Sig is generated in terms of the modified reference signal $V_{ref}'$, the switch voltage $V_{SW}$, and the current sense voltage $I_{sen}$. The linear amplifier current preferably is conditioned with a P.I. block.

$$Sig = \frac{\int \{V_{ref}' - V_{sw} + f(I_{lin})\}dt}{\frac{V_{in}T_s}{2}}$$

$$f(I_{lin}) = aI_{lin} + b\left(\int I_{lin}dt\right)$$

Alternatively, the PI block can be omitted.

The gain of the feedback signal Sig preferably is determined by the well known "equal slope criterion", which is optimal for PWM conversion. When the P.I. block is omitted, the average value of the linear amplifier current becomes equal to the resistive voltage drop in the inductor (L).

Figure 3:
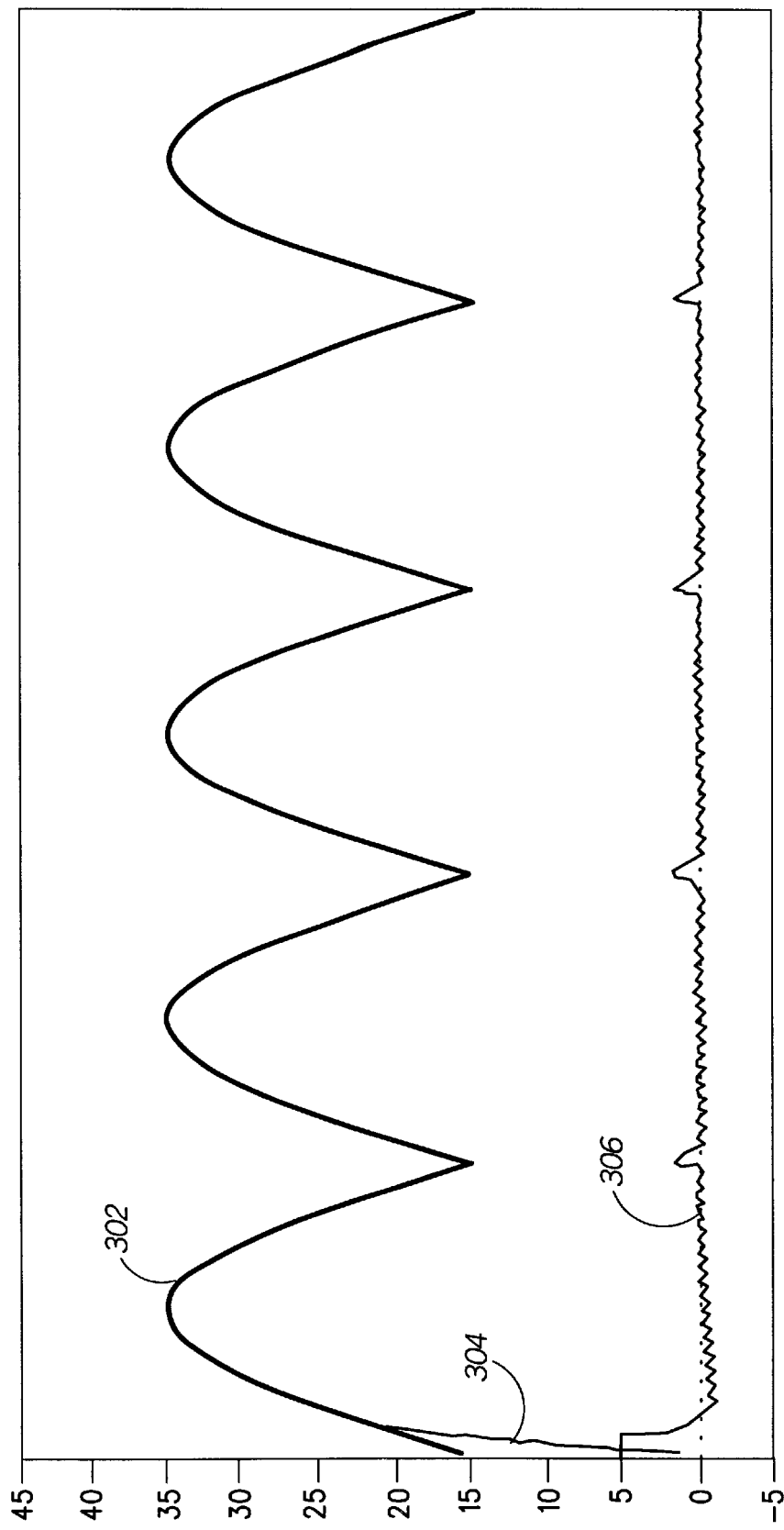
FIG. 3 is a performance diagram of the first embodiment in accordance with the present invention.

The two-pole switching amplifier system was simulated, built and tested. The results are depicted in FIG. 3, a performance diagram 300 of the first embodiment in accordance with the present invention. The graph 302 depicts the reference signal $V_{ref}$, which is the desired output voltage. The graph 304 is the output voltage $V_{out}$. Note that the output voltage $V_{out}$ tracks the reference signal $V_{ref}$ very closely except for a brief instant at start-up.

The graph 306 depicts the output current $I_{lin}$ of the linear amplifier 102. Note that the average value of $I_{lin}$ advantageously is driven near zero. A limitation encountered with the first embodiment of the power amplifier 100 was that the switching noise was not attenuated as much as desired. The ability of the linear amplifier 102 to suppress noise is reduced at higher frequencies, while the switching noise can be reduced for a given switching amplifier only by going to a higher frequency. The solution is to use a higher order filter, as disclosed herein below for the second embodiment 400 of the power amplifier 100 in accordance with the present invention.

Figure 4:
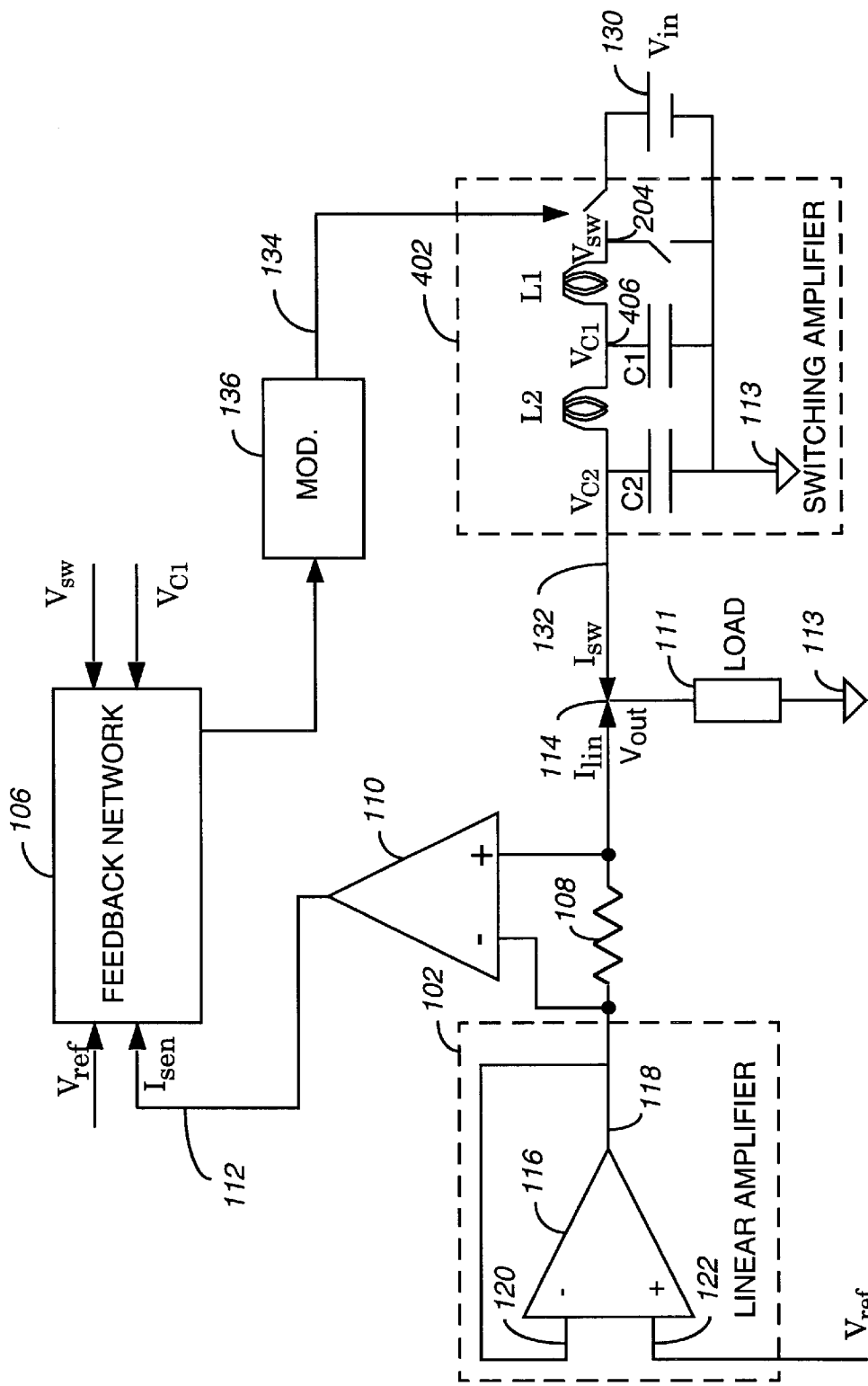
FIG. 4 is an electrical block diagram of a second embodiment of the power amplifier in accordance with the present invention.

FIG. 4 is an electrical block diagram of the second embodiment 400. The second embodiment 400 is similar to the first embodiment 200, the essential differences being a switching amplifier 402 having a two-stage filter, and a minor change in the feedback network 106, which will be described further below. The switching amplifier 402 comprises a first filter stage L1, C1 and a second filter stage L2, C2. The first inductor L1 is coupled between the switching node 204 (which serves as the first-stage input node) and an intermediate node 406 (which serves as the second-stage input node) having a voltage $V_{C1}$. The first capacitor C1 is coupled between the intermediate node 406 and the common node 113. The second inductor L2 is coupled between the intermediate node 406 and the output node 114. The second capacitor C2 is coupled between the output node 114 and the common node 113.

Figure 5:
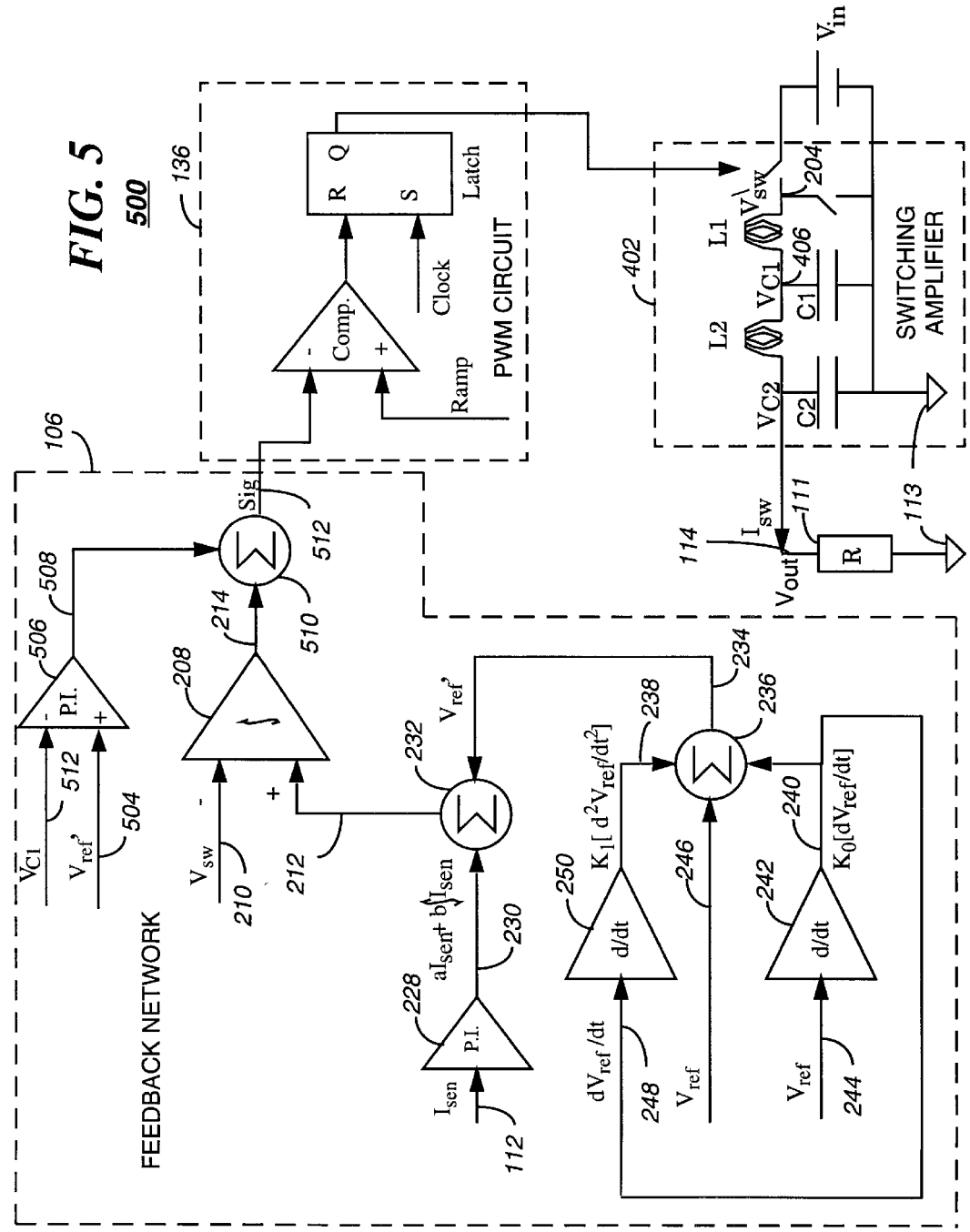
FIG. 5 is an electrical block diagram detailing a feedback network and a switching amplifier of the second embodiment of the power amplifier in is accordance with the present invention.

FIG. 5 is an electrical block diagram 500 detailing the feedback network 106 and the switching amplifier 402 of the second embodiment of the power amplifier 100 in accordance with the present invention. The feedback network 106 of FIG. 5 is similar to the feedback network 106 depicted in FIG. 2, the essential difference being the addition of a summer 510 and a subtraction P.I. circuit 506. The output 512 of the summer 510 carries the output signal Sig of the feedback network 106 and is coupled to the PWM circuit for controlling the PWM duty cycle. One input of the summer 510 is coupled to the output 214 of the subtraction integrator 208. Another input of the summer 510 is coupled to the output 508 of the subtraction P.I. circuit 506. The positive input of the subtraction P.I. circuit 506 is coupled to the output 234 of the summer 236 for receiving the intermediate signal $V_{ref}$. The negative input of the subtraction P.I. circuit 506 is coupled to the intermediate node 406 of the switching amplifier 402 for receiving the voltage $V_{C1}$ from the switching amplifier 402.

Figure 6:
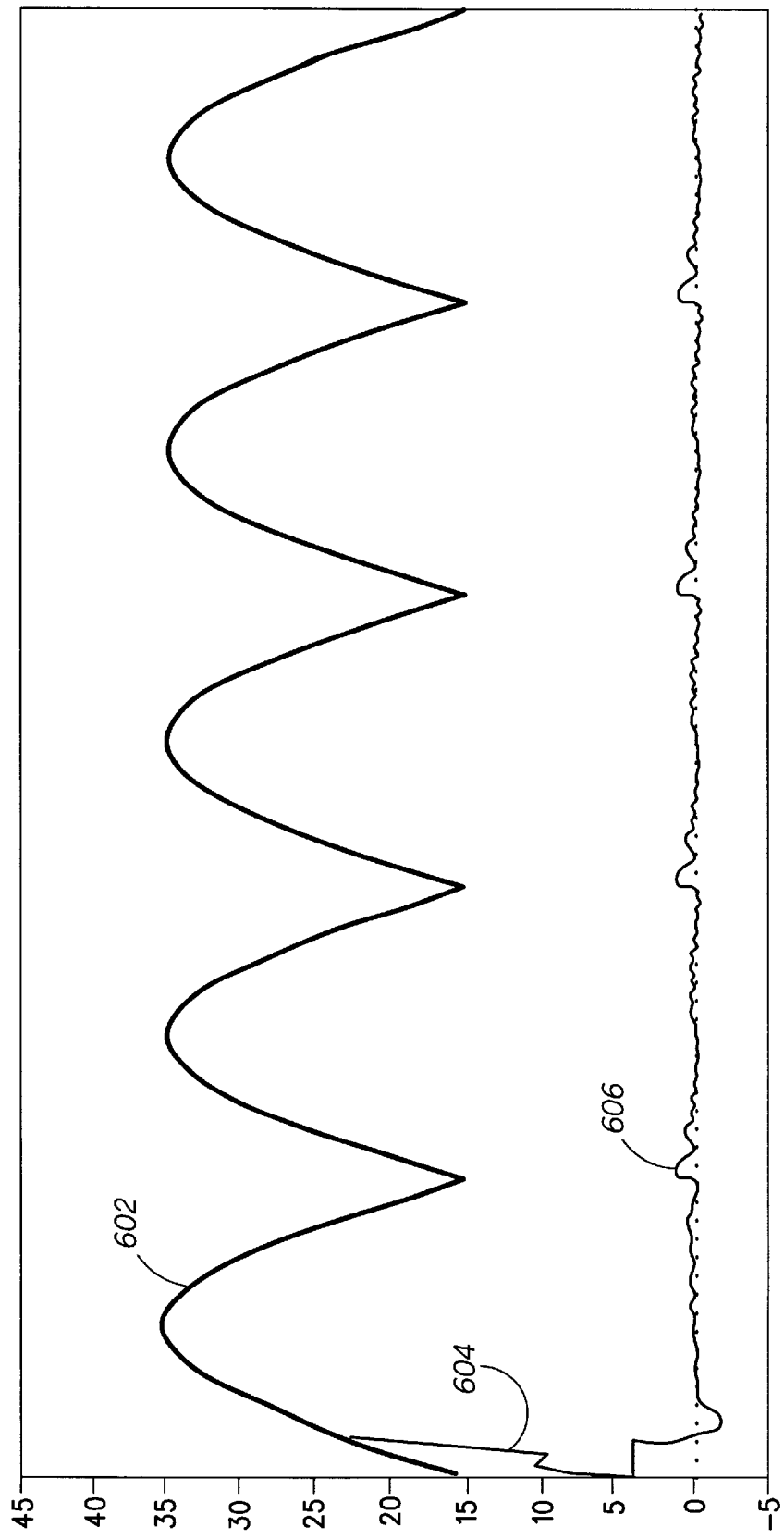
FIG. 6 is a performance diagram of the second embodiment in accordance with the present invention.

FIG. 6 is a performance diagram 600 of the second embodiment in accordance with the present invention. The graphs 602, 604, and 606 depict the reference signal $V_{ref}$, the output voltage $V_{out}$, and the linear amplifier current $I_{lin}$, respectively. Here the switching noise has been reduced due to the fourth order filter. The filter has high rejection of the switching noise while allowing relatively high frequencies to pass through. Note that the linear amplifier 102 is active only at times when the reference signal $V_{ref}$ has a sharp transition. This is in contrast to the two pole filter, where the linear amplifier 102 has to cancel a significant current ripple as shown in FIG. 3.

Figure 7:
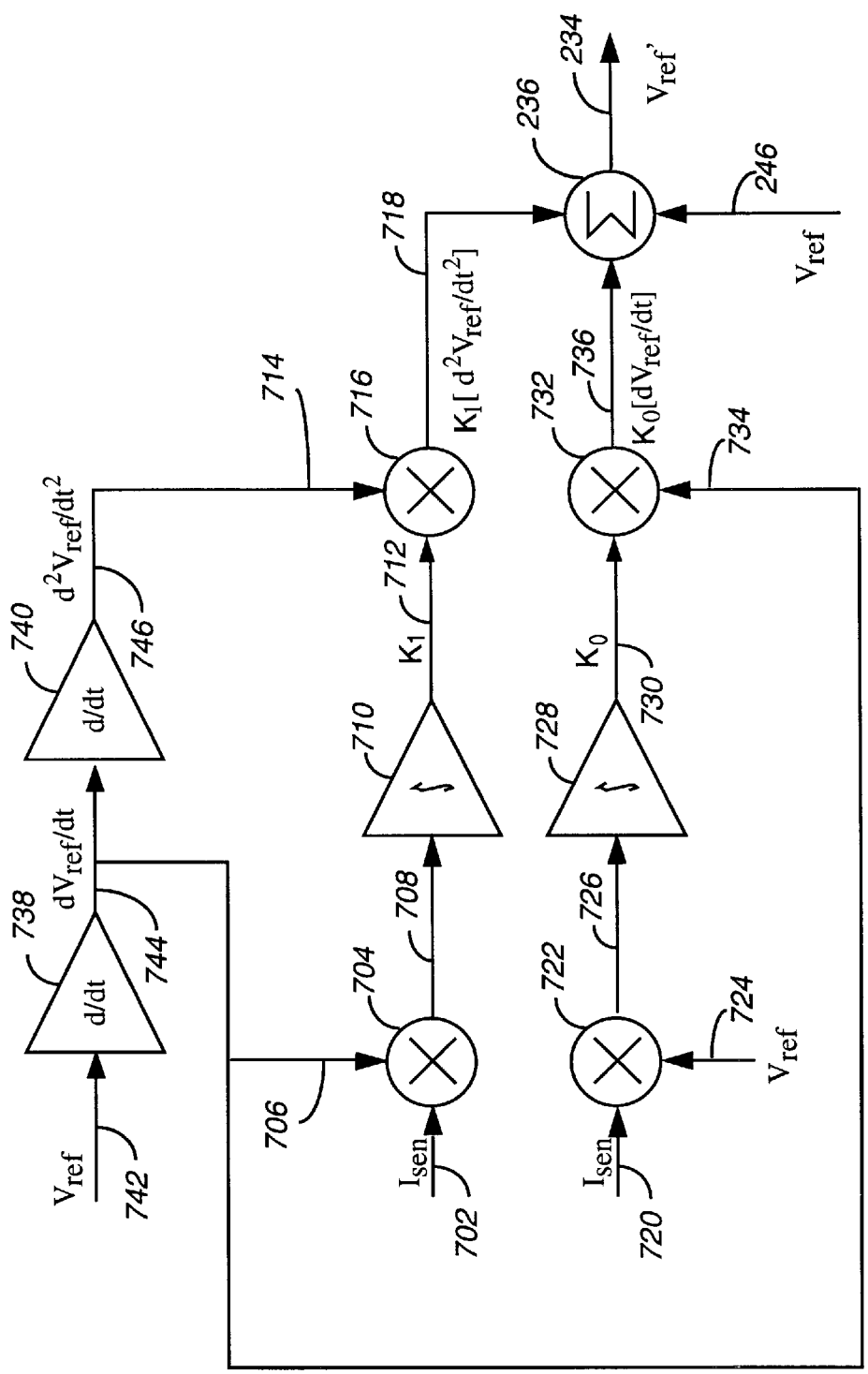
FIG. 7 is an electrical block diagram of an auto tuning circuit in accordance with the present invention.

FIG. 7 is an electrical block diagram of an auto tuning circuit 700 in accordance with the present invention. The auto tuning circuit 700 replaces the first and second differentiators 242, 250 with two differentiators 738, 740, four multipliers 704, 716, 722, 732, and two integrators 710, 728. Preferably, the multipliers 704, 716, 722, 732 are similar to the AD633 multiplier manufactured by Analog Devices, Inc. of Norwood, Mass. It will be appreciated that other similar multipliers can be used as well for the multipliers 704, 716, 722, 732. The inputs 702, 706 of the first multiplier 704 are coupled, respectively, to the current sense output 112 for receiving the current sense voltage $I_{sen}$, and to the output 744 of a first differentiator 738 having an input coupled to the reference signal $V_{ref}$. The first differentiator 738 generates a signal representing the derivative of the reference signal $dV_{ref}/dt$. The output 708 of the first multiplier 704 is coupled to the first integrator 710, whose output is coupled to a first input 712 of the second multiplier 716. The first integrator 710 generates a value representing the coefficient $K_1$. A second input 714 of the second multiplier 716 is coupled to the output 746 of the second differentiator 740. The input of the second differentiator is coupled to the output 744 of the first differentiator 738. The output of the second differentiator 740 represents the second derivative of the reference signal $d^2V_{ref}/dt^2$. The output of the second multiplier 716 thus represents the signal $K_1\{d^2V_{ref}/dt^2\}$, which is coupled to a first input 718 of the second summer 236 for generating $V_{ref}$ at the output 234.

Inputs 720, 724 of the third multiplier 722 are coupled, respectively, to $I_{sen}$ and $V_{ref}$. The output 726 of the third multiplier 722 is coupled to the input of the second integrator 728. The second integrator 728 generates a signal representing the coefficient $K_0$. This signal is coupled to a first input 730 of the fourth multiplier 732. A second input 734 of the fourth multiplier 732 is coupled to the output 744 of the first differentiator 738, representing the derivative of the reference signal $dV_{ref}/dt$. The output of the fourth multiplier 732 thus represents the signal $K_0\{dV_{ref}/dt\}$, which is coupled to a second input 736 of the second summer 236. A third input 246 of the second summer is coupled to the reference signal $V_{ref}$.

The auto tuning circuit 700 operates to tune the values of the coefficients $K_0$ and $K_1$. The linear amplifier current $I_{lin}$ (represented by the sense voltage $I_{sen}$) is effectively the error in the current output of the switching amplifier. Thus it can be used as an error signal for tuning the coefficients $K_0$ and $K_1$. An error in $K_0$ results in an error of $K_0 \times V_{ref}$ in the switching amplifier current. Similarly, an error in $K_1$ results in an error of $K_1 \times (dVref/dt)$. These can be tuned using an adaptive tuning algorithm similar to that described in "Feedforward active filter for output ripple cancellation", by Pallab Midya and Philip T. Krein, pp. 1–14, International Journal of Electronics, 1994, USA.

When the tuning algorithm has converged, the values for $K_0$ and $K_1$ are constant. This implies that the integrand has no dc value. The integrand in this case is $V_{ref} \times I_{sen}$ and $(dV_{ref}/dt) \times I_{sen}$ for $K_0$ and $K_1$, respectively. This condition is satisfied when $I_{sen}$ is mathematically uncorrelated to $V_{ref}$ and its time derivative. Thus, to the first and second order, the feedback to the switching amplifier 104 is optimized. Performance of the auto tuning circuit 700 is described further below.

Figure 8:
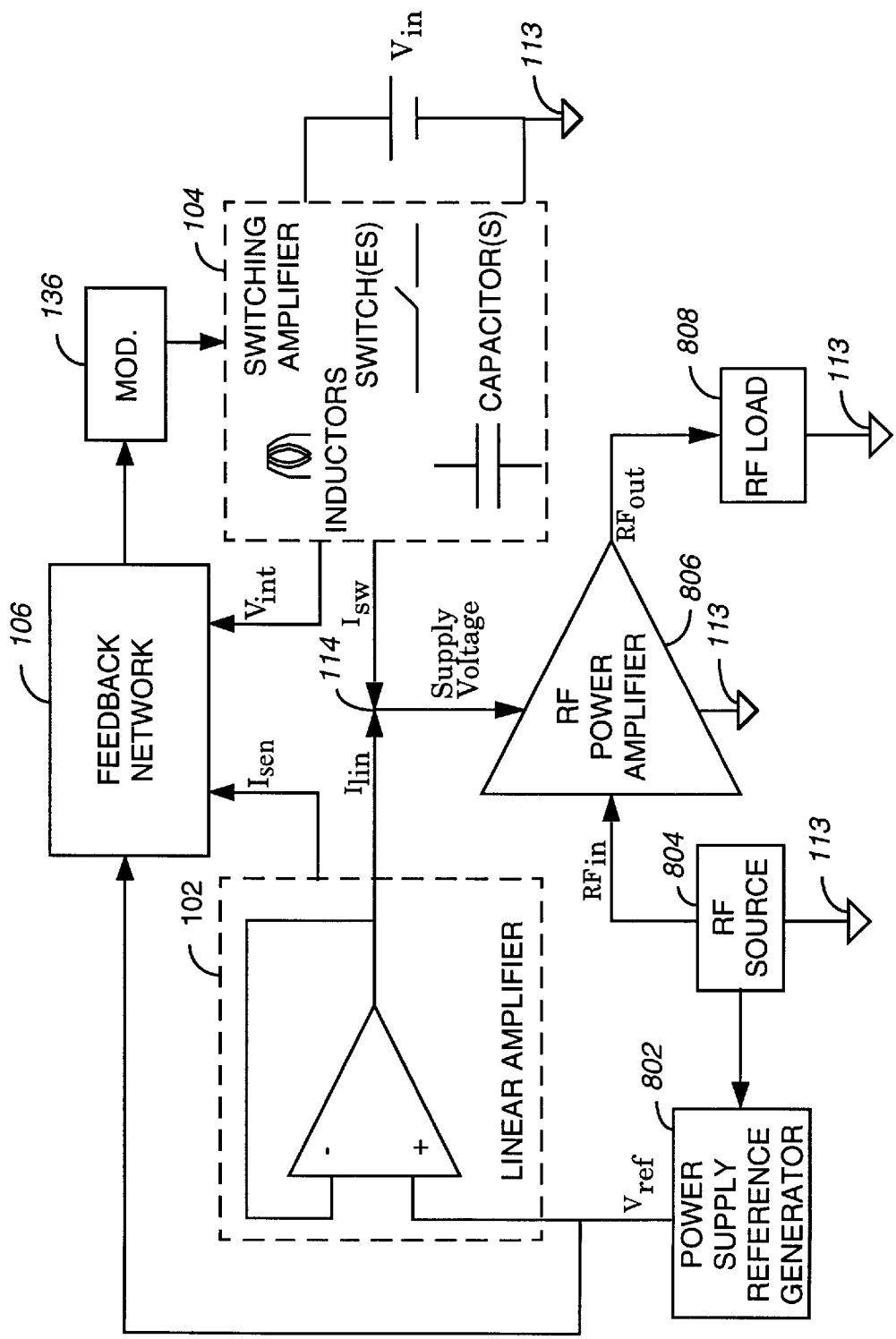
FIG. 8 is an electrical block diagram of a radio transmitter in accordance with the present invention.

FIG. 8 is an electrical block diagram of a radio transmitter 800 in accordance with the present invention. The radio transmitter 800 comprises the power amplifier 100 as disclosed herein above, and a power supply reference generator 802 coupled to the linear amplifier 102 and coupled to the feedback network 106 for providing the reference signal $V_{ref}$ thereto. The radio transmitter 800 further comprises a radio frequency (RF) power amplifier 806 coupled to the output node 114 for receiving the output voltage $V_{out}$ as a supply voltage for the RF power amplifier 806. In addition, the radio transmitter 800 comprises an RF source 804 coupled to the RF power amplifier 806 for generating an RF signal which is amplified by the RF power amplifier 806, and an RF load, such as an antenna, coupled to the RF power amplifier 806. Preferably, the power supply reference generator 802 is also coupled to the RF source for synchronizing the power supply reference generator 802 with an amplitude modulation of the RF source. In this way so the power amplifier 100 can supply the RF power amplifier 806 with just enough supply voltage to meet the needs of the RF power amplifier 806 at each instant, thereby greatly improving the efficiency of the RF power amplifier 806.

FIGS. 9–14 are exemplary electrical block diagrams detailing portions of the feedback network 106 in accordance with the present invention. FIG. 9 is a differentiator 900. The differentiator 900 comprises a capacitor 902 coupled to the negative input 908 of a conventional operational amplifier, such as the MC34074A operational amplifier manufactured by Motorola, Inc. of Schaumburg, Ill. A resistor 906 is coupled from the output 912 to the negative input 908. The positive input 910 is coupled to a common node, such as circuit ground. When a voltage V is applied to the uncoupled side of the capacitor 902, the output 912 produces a voltage of $-kdV/dt$, the value of k dependent upon the relative values of the resistor 906 and the capacitor 902. The differentiator 900 is an exemplary circuit for the differentiators 242, 250, 738, 740. It will be appreciated that, alternatively, other similar circuits for differentiators can be used as well for the differentiators 242, 250, 738, 740.

FIG. 10 is a P.I. circuit 1000. The P.I. circuit 1000 comprises a first resistor 1002 coupled between a common node and the negative input 1004 of a conventional operational amplifier 1008. A capacitor 1010 and a second resistor 1014 are series coupled between the negative input 1004 and the output 1012 of the amplifier 1008. When a voltage V is applied to the positive input 1006, the output produces a voltage of $aV+b\{Integral(V)\}$, the values of the constants a and b dependent upon the relative values of the resistor 1002 and the capacitor 1010. The P.I. circuit 1000 is an exemplary circuit for the P.I. circuits 228, 506. It will be appreciated that, alternatively, other similar P.I. circuits can be used as well for the P.I. circuits 228, 506.

FIG. 11 is an integrator 1100. The integrator 1100 comprises a resistor 1102 coupled to the negative input 1104 of a conventional operational amplifier 1108. A capacitor 1110 is coupled between the negative input 1104 and the output 1112. The positive input 1106 is coupled to a common node. When a voltage V is applied to the uncoupled end of the resistor 1102, the output produces a voltage equal to $-k\{Integral(V)\}$, the value of k dependent upon the relative values of the capacitor 1110 and the resistor 1102. The integrator 1100 is an exemplary circuit for the integrators 710, 728. It will be appreciated that, alternatively, other similar integrator circuits can be used as well for the integrators 710, 728.

FIG. 12 is a summer 1200. The summer 1200 comprises a first resistor 1202 coupled between a common node and the negative input 1210 of a conventional operational amplifier 1214. A second resistor 1218 is coupled between the output 1216 and the negative input 1210. Third, fourth, and fifth resistors 1204, 1206, and 1208 are coupled to the positive input of the amplifier 1214. When three voltages V1, V2, V3 are applied to the uncoupled ends of the resistors 1204, 1206, 1208, the output 1216 produces a voltage equal to $k(V1+V2+V3)$, k dependent upon the relative values of the resistors 1202–1208 and 1218. The summer 1200 is an exemplary circuit for the summers 232, 236, 510. It will be appreciated that, alternatively, other similar summers can be used as well for the summers 232, 236, 510.

FIG. 13 is a subtraction integrator 1300. The subtraction integrator 1300 comprises a first resistor 1302 coupled to the negative input 1304 of a conventional operational amplifier 1310. A first capacitor 1312 is coupled between the output 1316 and the negative input 1304. A second resistor 1306 is coupled to the positive input 1308. A second capacitor 1314 is coupled between the positive input 1308 and a common node. When a voltage V2 is applied to the uncoupled end of the first resistor 1302, and a voltage V1 is applied to the uncoupled end of the second resistor 1306, the output 1316 produces a voltage equal to $k\{Integral(V1-V2)\}$, k dependent upon the relative values of the resistors 1302, 1306 and the capacitors 1312, 1314. The subtraction integrator 1300 is an exemplary circuit for the subtraction integrator 208. It will be appreciated that, alternatively, other similar subtraction integrator circuits can be used as well for the subtraction integrator 208.

FIG. 14 is a subtraction P.I. circuit 1400. The subtraction P.I. circuit 1400 comprises a first resistor 1402 coupled to the negative input 1404 of a conventional operational amplifier 1420. A first capacitor 1410 and a second resistor 1412 are series coupled between the output 1418 and the negative input 1404. The subtraction P.I. circuit 1400 further comprises a third resistor 1406 coupled to the positive input 1408. A second capacitor 1414 and a fourth resistor 1416 are series coupled between the positive input 1408 and a common node. When a voltage V2 is applied to the uncoupled end of the first resistor 1402, and a voltage V1 is applied to the uncoupled end of the third resistor 1406, the output 1418 produces a voltage equal to $a(V1-V2)+b\{Integral(V1-V2)\}$, the constants a and b being dependent upon the relative values of the resistors 1402, 1412, 1406, 1416 and the capacitors 1410, 1414. The subtraction P.I. circuit 1400 is an exemplary circuit for the subtraction PI. circuit 506. It will be appreciated that, alternatively, other similar subtraction P.I. circuits can be used as well for the subtraction P.I. circuit 506.

Figure 15:
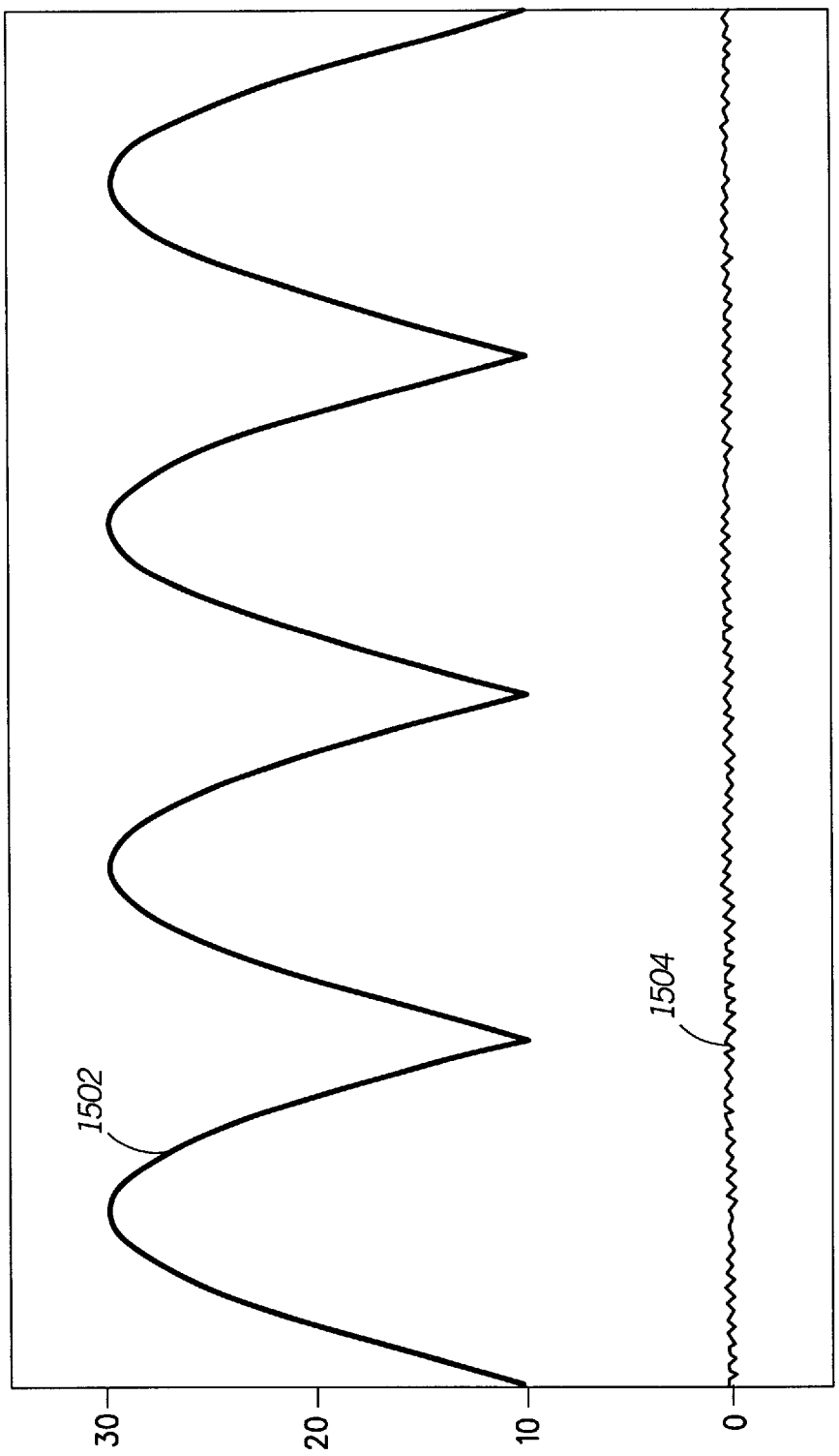
FIG. 15 is a performance diagram of the first embodiment when tuned with the auto tuning circuit of FIG. 7 in accordance with the present invention.

FIG. 15 is a performance diagram of the first embodiment when tuned with the auto tuning circuit of FIG. 7 in accordance with the present invention. The graph 1502 depicts both the reference signal $V_{ref}$ and the output voltage $V_{out}$. The graph 1504 represents the linear amplifier current $I_{lin}$. Note that the linear amplifier current $I_{lin}$ has been minimized and is equal to the ripple current only. The tuning process can be made faster or slower depending on the amount of noise in the linear amplifier current. The simultaneous tuning of the terms proportional to the reference signal $V_{ref}$ and its derivative is possible since the two terms are orthogonal in longer time frames. In the simulation depicted, the initial values were chosen to be zero. Testing was also done with various initial values and the results are independent of the initial conditions.

When converged the auto tuning process makes the linear amplifier current $I_{lin}$ uncorrelated to the reference signal $V_{ref}$ and its derivative. The plot of the linear amplifier current indicates that is indeed the case. After convergence the linear amplifier current is minimized and there is improvement over the performance without auto tuning.

Thus, it should be clear from the preceding disclosure that the present invention provides a high bandwidth, low noise baseband amplifier which operates at a lower switching frequency than possible in prior art switching amplifiers. Many modifications and variations of the present invention are possible in light of the above teachings. Thus, it is to be understood that, within the scope of the appended claims, the invention may be practiced other than as described herein above.

What is claimed is:

1. An amplifier apparatus, comprising:
   an output node having an output voltage;
   a switching amplifier having a first output coupled to the output node for delivering a switching amplifier output current to the output node;
   a modulator coupled to the switching amplifier for controlling the switching amplifier;
   a linear amplifier producing a linear amplifier output current through a second output coupled to the output node; and
   a feedback network coupled to the modulator for controlling the modulator, the feedback network also coupled to a reference signal which the amplifier apparatus tracks, the feedback network further coupled to a current sense signal proportional to the linear amplifier output current, and coupled to a switching amplifier signal internal to the switching amplifier, the switching amplifier signal not derived from the output voltage and not generated by sensing the switching amplifier output current.

2. The amplifier apparatus of claim 1, wherein the modulator comprises a pulse width modulator.

3. The amplifier apparatus of claim 1,
   wherein the switching amplifier comprises a single-stage filter having an input node, and
   wherein the feedback network is coupled to the switching amplifier signal at the input node of the filter.

4. The amplifier apparatus of claim 1,
   wherein the switching amplifier comprises a two-stage filter having a first-stage input node and a second-stage input node, and
   wherein the feedback network is coupled to the switching amplifier signal at the first-stage input node and at the second-stage input node.

5. The amplifier apparatus of claim 1, wherein the feedback network comprises an integrator coupled to the switching amplifier signal and coupled to the reference signal modified by a time derivative of the reference signal.

6. The amplifier apparatus of claim 1, wherein the feedback network comprises an integrator coupled to the switching amplifier signal and coupled to the reference signal modified by a time derivative of the reference signal, and further coupled to the current sense signal.

7. The amplifier apparatus of claim 1, wherein the feedback network comprises a summer for modifying the reference signal by a time derivative of the reference signal.

8. The amplifier apparatus of claim 7, wherein the summer is coupled to signals representing first and second time derivatives of the reference signal for modifying the reference signal by the first and second time derivatives of the reference signal.

9. The amplifier apparatus of claim 1, wherein the feedback network comprises an auto tuning circuit coupled to the current sense signal and coupled to the reference signal for adaptively controlling a modification of the reference signal by a time derivative of the reference signal to optimize the feedback network.

10. The amplifier apparatus of claim 9, wherein the auto tuning circuit comprises a multiplier and an integrator coupled to the multiplier for determining a coefficient that controls the modification of the reference signal.

11. A radio transmitter, comprising:
    a power supply reference generator for generating a reference signal;
    an amplifier apparatus coupled to the power supply reference generator for generating an output signal that tracks the reference signal;
    a radio frequency (RF) power amplifier coupled to the amplifier apparatus for amplifying an RF signal, the RF power amplifier powered by the output signal of the amplifier apparatus and producing an amplified RF signal; and
    an RF source for generating the RF signal,
    wherein the amplifier apparatus comprises:
      an output node having an output voltage;
      a switching amplifier having a first output coupled to the output node for delivering a switching amplifier output current to the output node;
      a modulator coupled to the switching amplifier for controlling the switching amplifier;
      a linear amplifier producing a linear amplifier output current through a second output coupled to the output node; and
      a feedback network coupled to the modulator for controlling the modulator, the feedback network also coupled to the reference signal, which the amplifier apparatus tracks, the feedback network further coupled to a current sense signal proportional to the linear amplifier output current, and coupled to a switching amplifier signal internal to the switching amplifier, the switching amplifier signal not derived from the output voltage and not generated by sensing the switching amplifier output current.

12. The radio transmitter of claim 11, wherein the modulator comprises a pulse width modulator.

13. The radio transmitter of claim 11,
    wherein the switching amplifier comprises a single-stage filter having an input node, and
    wherein the feedback network is coupled to the switching amplifier signal at the input node of the filter.

14. The radio transmitter of claim 11,
    wherein the switching amplifier comprises a two-stage filter having a first-stage input node and a second-stage input node, and
    wherein the feedback network is coupled to the switching amplifier signal at the first-stage input node and at the second-stage input node.

15. The radio transmitter of claim 11, wherein the feedback network comprises an integrator coupled to the switching amplifier signal and coupled to the reference signal modified by a time derivative of the reference signal.

16. The radio transmitter of claim 11, wherein the feedback network comprises an integrator coupled to the switching amplifier signal and coupled to the reference signal modified by a time derivative of the reference signal, and further coupled to the current sense signal.

17. The radio transmitter of claim 11, wherein the feedback network comprises a summer for modifying the reference signal by a time derivative of the reference signal.

18. The radio transmitter of claim 17, wherein the summer is coupled to signals representing first and second time derivatives of the reference signal for modifying the reference signal by the first and second time derivatives of the reference signal.

19. The radio transmitter of claim 11, wherein the feedback network comprises an auto tuning circuit coupled to the current sense signal and coupled to the reference signal for adaptively controlling a modification of the reference signal by a time derivative of the reference signal to optimize the feedback network.

20. The radio transmitter of claim 19, wherein the auto tuning circuit comprises a multiplier and an integrator coupled to the multiplier for determining a coefficient that controls the modification of the reference signal.

* * * * *